US006859303B2

(12) United States Patent
Wang et al.

(10) Patent No.: US 6,859,303 B2

(45) Date of Patent: Feb. 22, 2005

(54) OPTICAL COMPONENTS EXHIBITING ENHANCED FUNCTIONALITY AND METHOD OF MAKING SAME

(75) Inventors: Jian Wang, Orefield, PA (US); Hubert Kostal, Fair Haven, NJ (US)

(73) Assignee: NanoOpto Corporation, Somerset, NJ (US)

(*) Notice: Subject to any disclaimer, the term of this patent is extended or adjusted under 35 U.S.C. 154(b) by 0 days.

(21) Appl. No.: 10/463,883

(22) Filed: Jun. 17, 2003

(65) Prior Publication Data

US 2004/0042101 A1 Mar. 4, 2004

Related U.S. Application Data

(60) Provisional application No. 60/389,512, filed on Jun. 18, 2002.

(51) Int. Cl.[7] ............................ G02F 1/00; G02B 6/26; H01L 21/44

(52) U.S. Cl. ........................ 359/321; 359/322; 385/27; 438/615

(58) Field of Search ................................ 359/321, 322, 359/298; 385/27, 28, 50, 123; 438/615

(56) References Cited

U.S. PATENT DOCUMENTS

| | | | | |
|---|---|---|---|---|
| 4,615,034 | A | 9/1986 | Von Gunten et al. | 372/99 |
| 4,638,669 | A | 1/1987 | Chou | 73/514.25 |
| 4,650,289 | A | 3/1987 | Kuwahara | 359/484 |
| 4,732,444 | A | 3/1988 | Papuchon et al. | 385/40 |
| 4,763,972 | A | 8/1988 | Papuchon et al. | 385/11 |
| 4,778,234 | A | 10/1988 | Papuchon et al. | 385/132 |
| 4,998,793 | A | 3/1991 | Henry et al. | 385/1 |
| 5,077,816 | A | 12/1991 | Glomb et al. | 385/37 |
| 5,088,105 | A | 2/1992 | Scifres et al. | 372/92 |
| 5,091,981 | A | 2/1992 | Cunningham | 385/3 |
| 5,283,845 | A | 2/1994 | Ip | 385/24 |
| 5,299,212 | A | 3/1994 | Koch et al. | 372/32 |
| 5,461,246 | A | 10/1995 | Chou | 257/449 |
| 5,467,415 | A | 11/1995 | Presby | 385/14 |
| RE35,337 | E | 9/1996 | Patel et al. | 349/72 |
| 5,617,234 | A | 4/1997 | Koga et al. | 398/14 |
| 5,654,818 | A | 8/1997 | Yao | 359/246 |
| 5,691,989 | A | 11/1997 | Rakuljic et al. | 372/20 |
| 5,706,301 | A | 1/1998 | Lagerstrom | 372/32 |
| 5,719,976 | A | 2/1998 | Henry et al. | 385/50 |
| 5,726,805 | A | 3/1998 | Kaushik et al. | 359/589 |
| 5,772,905 | A | 6/1998 | Chou | 216/44 |
| 5,777,793 | A | 7/1998 | Little et al. | 359/584 |
| 5,793,784 | A | 8/1998 | Wagshul et al. | 372/32 |

(List continued on next page.)

OTHER PUBLICATIONS

Austin, M., et al., "Fabrication for nanocontacts for molecular devices using nanoimprint lithography," J. Vac. Sci. Technol. B 20(2), Mar./Apr. 2002, pp. 665–667.

Austin, M., et al., "Fabrication of 70 nm channel length polymer organic thin–film transistors using nanoimprint lithography," Appl. Phys. Lett. 81 (23), Dec. 2, 2002, pp. 4431–4433.

(List continued on next page.)

*Primary Examiner*—Timothy Thompson

(74) *Attorney, Agent, or Firm*—Reed Smith LLP

(57) ABSTRACT

The present invention is directed to a method for enhancing functionality for photonic devices each including at least one operable surface. This method includes stacking the photonic devices such that each of the operable surfaces are aligned to form a composite surface, applying a film adapted to receive a replication to the composite surface and replicating a pattern of nanostructures in the applied film. Substantially, each of the operable surfaces is replicated with a sufficient portion of the replicated pattern of nanostructures to enhance operation of the devices by performing a given function associated with the nanostructures.

34 Claims, 3 Drawing Sheets

U.S. PATENT DOCUMENTS

| | | | | |
|---|---|---|---|---|
| 5,820,769 | A | 10/1998 | Chou | 216/22 |
| 5,848,080 | A | 12/1998 | Dahm | 372/25 |
| 5,852,688 | A | 12/1998 | Brinkman et al. | 385/16 |
| 5,870,421 | A | 2/1999 | Dahm | 372/75 |
| 5,956,216 | A | 9/1999 | Chou | 360/131 |
| 5,966,483 | A | 10/1999 | Chowdhury | 385/37 |
| 5,973,316 | A | 10/1999 | Ebbesen et al. | 250/216 |
| 5,973,784 | A | 10/1999 | Szwaykowski et al. | 356/495 |
| 6,035,089 | A | 3/2000 | Grann et al. | 385/129 |
| 6,037,644 | A | 3/2000 | Daghighian et al. | 257/444 |
| 6,040,936 | A | 3/2000 | Kim et al. | 359/245 |
| 6,052,238 | A | 4/2000 | Ebbesen et al. | 359/738 |
| 6,064,506 | A | 5/2000 | Koors | 359/237 |
| 6,069,380 | A | 5/2000 | Chou et al. | 257/315 |
| 6,075,915 | A | 6/2000 | Koops et al. | 385/125 |
| 6,101,300 | A | 8/2000 | Fan et al. | 385/27 |
| 6,122,103 | A | 9/2000 | Perkins et al. | 359/486 |
| 6,122,301 | A | 9/2000 | Tei et al. | 372/32 |
| 6,125,220 | A | 9/2000 | Copner et al. | 385/27 |
| 6,130,969 | A | 10/2000 | Villeneuve et al. | 385/27 |
| 6,137,939 | A | 10/2000 | Henry et al. | 385/132 |
| 6,154,318 | A | 11/2000 | Austin et al. | 359/584 |
| 6,154,479 | A | 11/2000 | Yoshikawa et al. | 372/96 |
| 6,169,825 | B1 | 1/2001 | Morey et al. | 385/11 |
| 6,175,667 | B1 | 1/2001 | Wang et al. | 385/3 |
| 6,191,890 | B1 | 2/2001 | Baets et al. | 359/572 |
| 6,198,557 | B1 | 3/2001 | Dultz et al. | 398/102 |
| 6,198,860 | B1 | 3/2001 | Johnson et al. | 385/28 |
| 6,208,463 | B1 | 3/2001 | Hansen et al. | 359/486 |
| 6,215,928 | B1 | 4/2001 | Friesem et al. | 385/37 |
| 6,233,375 | B1 | 5/2001 | Lang et al. | 385/14 |
| 6,233,380 | B1 | 5/2001 | Ferrieu | 385/30 |
| 6,235,141 | B1 | 5/2001 | Feldman et al. | 156/250 |
| 6,240,109 | B1 | 5/2001 | Shieh | 372/18 |
| 6,251,297 | B1 | 6/2001 | Komuro et al. | 216/24 |
| 6,252,709 | B1 | 6/2001 | Sato | 359/492 |
| 6,253,009 | B1 | 6/2001 | Lestra et al. | 385/50 |
| 6,260,388 | B1 | 7/2001 | Borrelli et al. | 65/393 |
| 6,262,002 | B1 | 7/2001 | Carey | 510/110 |
| 6,263,002 | B1 | 7/2001 | Hsu et al. | 372/6 |
| 6,275,291 | B1 | 8/2001 | Abraham et al. | 356/367 |
| 6,285,810 | B1 | 9/2001 | Fincato et al. | 385/24 |
| 6,288,840 | B1 | 9/2001 | Perkins et al. | 359/486 |
| 6,309,580 | B1 | 10/2001 | Chou | 264/338 |
| 6,317,554 | B1 | 11/2001 | Kosaka et al. | 385/132 |
| 6,324,192 | B1 | 11/2001 | Tayebati | 372/20 |
| 6,339,603 | B1 | 1/2002 | Flanders et al. | 372/20 |
| 6,349,103 | B1 | 2/2002 | Chung et al. | 372/32 |
| 6,353,623 | B1 | 3/2002 | Munks et al. | 372/20 |
| 6,359,915 | B1 | 3/2002 | Koch et al. | 372/29.02 |
| 6,370,177 | B1 | 4/2002 | Genei et al. | 372/49 |
| 6,371,662 | B1 | 4/2002 | Leard et al. | 385/88 |
| 6,374,016 | B2 | 4/2002 | Albert et al. | 385/37 |
| 6,400,860 | B1 | 6/2002 | Chandrasekhar et al. | 385/24 |
| 6,410,416 | B1 * | 6/2002 | Dodabalapur et al. | 438/615 |
| 6,482,742 | B1 | 11/2002 | Chou | 438/690 |
| 6,518,189 | B1 | 2/2003 | Chou | 438/706 |
| 6,618,104 | B1 | 9/2003 | Date et al. | 349/86 |
| 6,661,952 | B2 | 12/2003 | Simpson et al. | 385/37 |
| 6,692,797 | B1 | 2/2004 | Owen et al. | 428/1.2 |
| 6,713,238 | B1 | 3/2004 | Chou et al. | 430/322 |

OTHER PUBLICATIONS

Bird, G.R. et al., "The Wire Grid as a Near–Infrafed Polarizer," J. of the Optical Soc. of America, 50 (9), 886–890, (1960).

Born, Max, and Wolf, Emil: Principles of Optics: Electromagnetic Theory of Propagation, Interference and Diffraction of Light 7th ed. Oct. 1, 1999. Cambridge University Press, p. 790.

Brundrett, D. L.., et al., "Normal–incidence guided–mode resonant grating filters: design and experimental demonstration" Optics Lett., May 1, 1998;23(9):700–702.

Cao, H., et al., "Fabrication of 10 nm enclosed nanofluidic channels," Appl. Phys. Lett. 81 (1), Jul. 1, 2002, pp. 174–176.

Cao, H., et al., "Gradient Nanostructures for interfacing microfluidics and nanofluidics," Appl. Phys. Lett. 81(16), Oct. 14, 2002, pp. 3058–3060.

Chang, Allan S. P., et al. "A new two–dimensional subwavelength resonant grating filter fabricated by nanoimprint lithography" Department of Electrical Engineering, NanoStructures Laboratory, Princeton University, no date available.

Chigrin, D. N.,et al., "Observation of total omnidirectional reflection from a one–dimensional dielectric lattice" Appl. Phy. A. 1999;65:25–28.

Chou, S. Y., et al., "Subwavelength transmission gratings and their applications in VCSELs" Proc. SPIE. 1997;3290:73–81.

Chou, S. Y., et al., "Observation of Electron Velocity Overshoot in Sub–100–nm–channel MOSFET's in Silicon," IEEE Electron Device Letters, vol. EDL–6, No. 12, Dec. 1985, pp. 665–667.

Chou, S.Y., et al., "Imprint Lithography with 25–Nanometer Resolution" April 5, 1996;272(5258):85–87.

Chou, S.Y. , et al., "Sub–10 nm imprint lithography and applications" J. Vac. Sci. Technol. B. Nov./Dec. 1997;15(6):2897–2904.

Chou, S., et al., "Imprint of sub–25 nm vias and trenches in polymers," Appl. Phys., Lett. 67 (21), Nov. 20, 1995, pp. 3114–3116.

Chou, S., et al., "Lateral Resonant Tunneling Transistors Employing Field–Induced Quantum Wells and Barriers," Proceedings of the IEEE, vol. 79, No. 8, Aug. 1991, pp. 1131–1139.

Chou, S., et al., "Nanoscale Tera–Hertz Metal–Semiconductor–Metal Photodetectors," IEEE Journal of Quantum Electronics, vol. 28, No. 10, Oct. 1992, pp. 2358–2368.

Chou, S., et al., "Ultrafast and direct imprint of nanostructures in silicon," Nature, vol. 417, Jun. 20, 2002, pp. 835–837.

Chou, S., G.A., "Patterned Magnetic Nanostructures and Quantized Magnetic Disks," Proceedings of the IEEE, vol. 85, No. 4, Apr. 1997, pp. 652–671.

Cui, B.,et al., "Perpendicular quantized magnetic disks with 45 Gbits on a 4×2 $cm^2$ area," Journal of Applied Physics, vol. 85, No. 8, Apr. 15, 1999, pp. 5534–5536.

Deshpande, P., et al., "Lithographically induced self–assembly of microstructures with a liquid–filled gap between the mask and polymer surface," J. Vac. Sci. Technol. B 19(6), Nov./Dec. 2001, pp. 2741–2744.

Deshpande, P., et al., "Observation of dynamic behavior lithographically induced self–assembly of supromolecular periodic pillar arrays in a homopolymer film," Appl. Phys. Lett. 79 (11), Sep. 10, 2001, pp. 1688–1690.

Fan, S., et al., "Design of three–dimensional photonic crystals at submicron lengthscales" Appl. Phys. Lett. Sep. 12, 1994;65(11)1466–1468.

Feiertag, G. , et al., "Fabrication of photonic crystals by deep x–ray lithography" Appl. Phys. Lett., Sep. 15, 1997;71(11):1441–1443.

Fink, Y., et al, "Guiding optical light in air using an all–dielectric structure" J. Lightwave Techn. Nov. 1999;17(11):2039–2041.

Fink, Y., et al, "A dielectric omnidirectional reflector" Science. Nov. 27, 1998;282:1679–1682.

Fischer, P.B., et al., "10 nm electron beam lithography and sub–50 nm overlay using a modified scanning electron microscope," Appl. Phys. Lett. 62 (23), Jun. 7, 1993, pp. 2989–2991.

Flanders, D.C., "Submicrometer periodicity gratings as artificial anisotropic dielectrics," Appl. Phys. Lett. 42 (6), 492–494 (1983).

Gabathuler, W., et al., "Electro–nanomechanically wavelength–tunable integrated–optical bragg reflectors Part II: Stable device operation" Optics Communications. Jan. 1, 1998;145:258–264.

Gaylord, Thomas K., et al., "Analysis and applications of optical diffraction by gratings," Proc. IEEE. May 1985;73(5):894–937.

Goeman, S., et al., "First demonstration of highly reflective and highly polarization selective diffraction gratings (GIRO–Gratings) for long–wavelength VCSEL's" IEEE Photon. Technol. Lett.Sep. 1998;10(9):1205–1207.

Hayakawa, Tomokazu, et al, "ARROW–B Type Polarization Splitter with Asymmetric Y–Branch Fabricated by a Self–Alignment Process," J. Lightwave Techn, 15(7),1165–1170, (1997).

Hereth, R., et al, "Broad–band optical directional couplers and polarization splitter," J. Lightwave Techn., 7(6), 925–930, (1989).

Ho, K.M., et al.,"Existance of a photonic gap in periodic dielectric structures" Dec. 17, 1990;65(25):3152–3155.

Ibanescu, M., et al., "An all–dielectric coaxial waveguide" Science. Jul. 21, 2000;289:415–419.

Joannopoulos, J.D., et al., "Photonic crystals: putting a new twist on light" Nature. Mar. 1997 13(6621):143–149.

Kokubun, Y. , et al, "ARROW–Type Polarizer Utilizing Form Birefringence in Multilayer First Cladding," IEEE Photon. Techn. Lett., 11(9), 1418–1420, (1993).

Kuksenkov, D. V. , et al., "Polarization related properties of vertical–cavity surface–emitting lasers" IEEE J. of Selected Topics in Quantum Electronics. Apr. 1997;3(2):390–395.

Levi, B.G. , "Visible progress made in three–dimensional photonic 'crystals'" Physics Today. Jan. 1999;52(1):17–19.

Li, M., et al., "Direct three–dimensional patterning using nanoimprint lithography," Appl. Phys. Lett. 78 (21), May 21, 2001, pp. 3322–3324.

Li, M., et al., "Fabrication of circular optical structures with a 20 nm minimum feature using nanoimprint lithography," Appl. Phys. Lett. 76 (6), Feb. 7, 2000, pp. 673–675.

Magel, G.A., "Integrated optic devices using micromachined metal membranes" SPIE. Jan. 1996;2686:54–63.

Magnusson, R., et al., "New principle for optical filters" Appl. Phys. Lett. Aug. 31, 1992;61(9):1022–1023.

Mashev, L., et al., "Zero order anomaly of dielectric coated gratings" Optics Communications. Oct. 15, 1985; 55(6):377–380.

Moharam, M. G., et al., "Rigorous coupled–wave analysis of planar–grating diffraction" J. Opt. Soc. Am. Jul. 1981;71(7):811–818.

Mukaihara, T., et al., "Engineered polarization control of GaAs/AlGaAs surface emitting lasers by anisotropic stress from elliptical etched substrate hole" IEEE Photon. Technol. Lett. Feb. 1993;5(2):133–135.

Noda, S., et al., "New realization method for three–dimensional photonic crystal in optical wavelength region" Jpn. J. Appl. Phys. Jul. 15, 1996;35:L909–L912.

Oh, M., et al., "Polymeric waveguide polarization splitter with a buried birefringent polymer" IEEE Photon. Techn. Lett. Sep. 1999;11(9):1144–1146.

Painter, O. , et al., "Lithographic tuning of a two–dimensional photonic crystal laser array" IEEE Photon. Techn. Lett., Sep. 2000;12(9):1126–1128.

Painter, O., et al., "Room temperature photonic crystal defect lasers at near–infrared wavelengths in InGaAsP" J. Lightwave Techn., Nov. 1999;17(11):2082–2088.

Peng, S., et al., "Experimental demonstration of resonant anomalies in diffraction from two–dimensional gratings" Optics Lett. Apr. 15, 1996;21(8):549–551.

Ripin, D. J., et al., "One–dimensional photonic bandgap microcavities for strong optical confinement in GaAs and GaAs/AlxOy semiconductor waveguides" J. Lightwave Techn. Nov. 1999;17(11):2152–2160.

Rokhinson, L.P., et al., "Double–dot charge transport in Si single–electron/hole transistors," Appl. Phys. Lett. 76 (12), Mar. 20, 2000, pp. 1591–1593.

Rokhinson, L.P., et al., "Kondo–like zero–bias anomaly in electronic transport through an ultrasmall Si quantum dot," Physical Review B, vol. 60, No. 24, Dec. 15, 1999, pp. 319–321.

Rokhinson, L.P., et al., "Magnetically Induced Reconstruction of the Ground State in a Few–Electron Si Quantum Dot," Physical Review Letters, vol. 87, No. 16, Oct. 15, 2001, pp. 1–3.

Rudin, A., et al., "Charge–ring model for the charge–induced confinement enhancement in stacked quantum–dot transistors," Appl. Phys. Lett. 73 (23), Dec. 7, 1998, pp. 3429–3431.

Russell, P. St. J., et al., "Full photonic bandgaps and spontaneous emission control in 1D multilayer dielectric structures" Opt. Commun. Feb. 1, 1999;160:66–71.

Rytov, S. M., "Electromagnetic properties of a finely stratified medium" Soviet Physics JETP (Journal of Experimental & Theoretical Physics). May 1956;2(1):466–475.

Schablitsky, S., et al., "Controlling polarization of vertical–cavity surface–emitting lasers using amorphous silicon subwavelength transmission gratings," Appl. Phys. Lett. 69 (1), Jul. 1, 1996, pp. 7–9.

Sharon, A. , et al., "Narrow spectral bandwidths with grating waveguide structures" Appl.Phys.Lett. Dec. 30, 1996;69(27):4154–4156.

Sugimoto, Y., et al., "Experimental verification of guided modes in 60 degrees—bent defect waveguides in AlGaAs–based air–bridge–type two–dimensional photonic crystal slabs" J. Appl. Phys. Mar. 1, 2002;91(5):3477–3479.

Sun, X., et al., "Multilayer resist methods for nanoimprint lithography on nonflat surfaces" J. Vac. Sci. Technol. B. Nov./Dec. 1998;16(6)3922–3925.

Tibuleac, S., et al., "Reflection and transmission guided–mode resonance filters" J. Opt. Soc. Am. A. Jul. 1997;14(7):1617–1626.

Trutschel, U. ,et al, "Polarization splitter based on anti–resonant reflecting optical waveguides," J Lightwave Techn., 13(2), 239–243, (1995).

Tyan, R.C., et al., "Design, fabrication and characterization of form–birefringent multilayer polarizing beam splitter" J. Opt. Soc. Am. A. Jul. 1997;14(7):1627–1636.

Tyan, R. et al., "Polarizing beam splitters constructed of form–birefringent multilayer gratings," SPIE 2689, 82–89.

van Blaaderenm, Alfons, "Opals in a New Light" Science. Oct. 30, 1998; 282(5390):887–888.

van Doorn, A. K. Jansen, et al., "Strain–induced birefringence in vertical–cavity semiconductor lasers" IEEE J. Quantum Electronics. Apr. 1998;34(4):700–706.

Vellekoop, A.R. et al, "A small–size polarization splitter based on a planar phase optical phased array," J Lightwave Techn., 8(1), 118–124, (1990).

Wang, J., et al., "Molecular alignment in submicron patterned polymer matrix using nano–imprint lithography," Appl. Phys. Lett. 77 (2), Jul. 10, 2000, pp. 166–168.

Wang, J., et al., "Fabrication of a new broadband waveguide polarizer with a double–layer 190 nm period metal–gratings using nanoimprint lithography" J. Vac. Sci. Technol. B. Nov./Dec. 1999;17(6):2957–2960.

Wang, S. S., et al., "Design of waveguide–grating filters with symmetrical line shapes and low sidebands" Opt. Lett. Jun. 15, 1994:19(12):919–921.

Wang, S. S., et al., "Guided–mode resonances in planar dielectric–layer diffraction gratings" J. Opt. Soc. Am. A. Aug. 1990;7(8):1470–1475.

Weber, M. F., Stover, C.A., Gilbert, L.R. , Nevitt, T.J. , Ouderkirk, A.J. "Giant birefringent optics in multilayer polymer mirrors," Science, 287, 2451–2456, Mar. 31, 2000.

Winn, J. N., et al., "Omnidirectional reflection from a one–dimensional photonic crystal" Opt. Lett. Oct. 15, 1998;23(20):1573–1575.

Wu, L., et al., "Dynamic modeling and scaling of nanostructure formation in the lithographically induced self–assembly and self–construction" Appl. Phys. Lett. May 12, 2003;82(19):3200–3202.

Yablonovitch, E., "Inhibited spontaneous emission in solid–state physics and electronics" Phys. Rev. Lett. May 18, 1987;58(20):2059–2062.

Yablonovitch, E., et al., "Photonic band structure: The face–centered–cubic case employing nonspherical atoms" Phys. Rev. Lett. Oct. 21, 1991;67(17):2295–2298.

Yanagawa, H. , et al, "High extinction guided–wave optical polarization splitter," IEEE Photon. Techn. Lett., 3(1), 17–18, (1991).

Yoshikawa, T., et al., "Polarization–controlled single–mode VCSEL" IEEE J. Quantum Electronics. Jun. 1998;34(6):1009–1015.

Yu, Z., et al., "Reflective polarizer based on a stacked double–layer subwavelength metal grating structure fabricated using nanoimprint lithography," Appl. Phys. Lett. 77 (7), Aug. 14, 2000, pp. 927–929.

Zakhidov, A.A., et al., "Carbon structures with three–dimensional periodicity at optical wavelengths" Science. Oct. 30, 1998;282(5390):897–901.

* cited by examiner

OPTICAL COMPONENTS EXHIBITING ENHANCED FUNCTIONALITY AND METHOD OF MAKING SAME

CROSS REFERENCE TO RELATED APPLICATIONS

This application claims the benefit of U.S. Provisional Application No. 60/389,512, filed Jun. 18, 2002, entitled "OPTICAL COMPONENTS EXHIBITING ENHANCED FUNCTIONALITY AND METHOD OF MAKING SAME", with the named Inventors, Jian Wang, Herbert Kostal and Yong Kewan Park.

FIELD OF THE INVENTION

The present invention relates generally to optical components, and particularly to optical components exhibiting enhanced functionality.

BACKGROUND OF THE INVENTION

In the field of optical networking, telecommunications, optical applications and photonics it is highly desirable to continually enhance device performance and reduce fabrication, packaging and assembly costs. Accordingly, multi-functional photonic components or photonic components exhibiting enhanced functionality are highly desirable. For example, it is desirable to provide a unitary photonic component, which may be incorporated into a Photonic Integrated Circuit (PIC), for example, which exhibits enhanced functionality, such as a type III-V semiconductor compound laser, compound modulator and $LiNbO_3$ modulator including a polarizer.

Such components, and PICS incorporating them, would represent a significant improvement in the state of the pertinent art.

SUMMARY OF THE INVENTION

A method for enhancing functionality for photonic devices each including at least one operable surface, the method including: stacking the photonic devices such that each of the operable surfaces are aligned to form a composite surface; applying a film adapted to receive a replication to the composite surface; and, replicating a pattern of nanostructures in the applied film, wherein substantially each of the operable surfaces is replicated with a sufficient portion of the replicated pattern of nanostructures to enhance operation of the devices by performing a given function associated with the nanostructures.

BRIEF DESCRIPTION OF THE FIGURES

Understanding of the present invention will be facilitated by consideration of the following detailed description of the preferred embodiments of the present invention taken in conjunction with the accompanying drawings, in which like numerals refer to like parts and in which.

DETAILED DESCRIPTION OF THE PREFERRED EMBODIMENTS

It is to be understood that the figures and descriptions of the present invention have been simplified to illustrate elements that are relevant for a clear understanding of the present invention, while eliminating, for the purpose of clarity, many other elements found in typical photonic components and methods of manufacturing the same. Those of ordinary skill in the art will recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Figure 1:
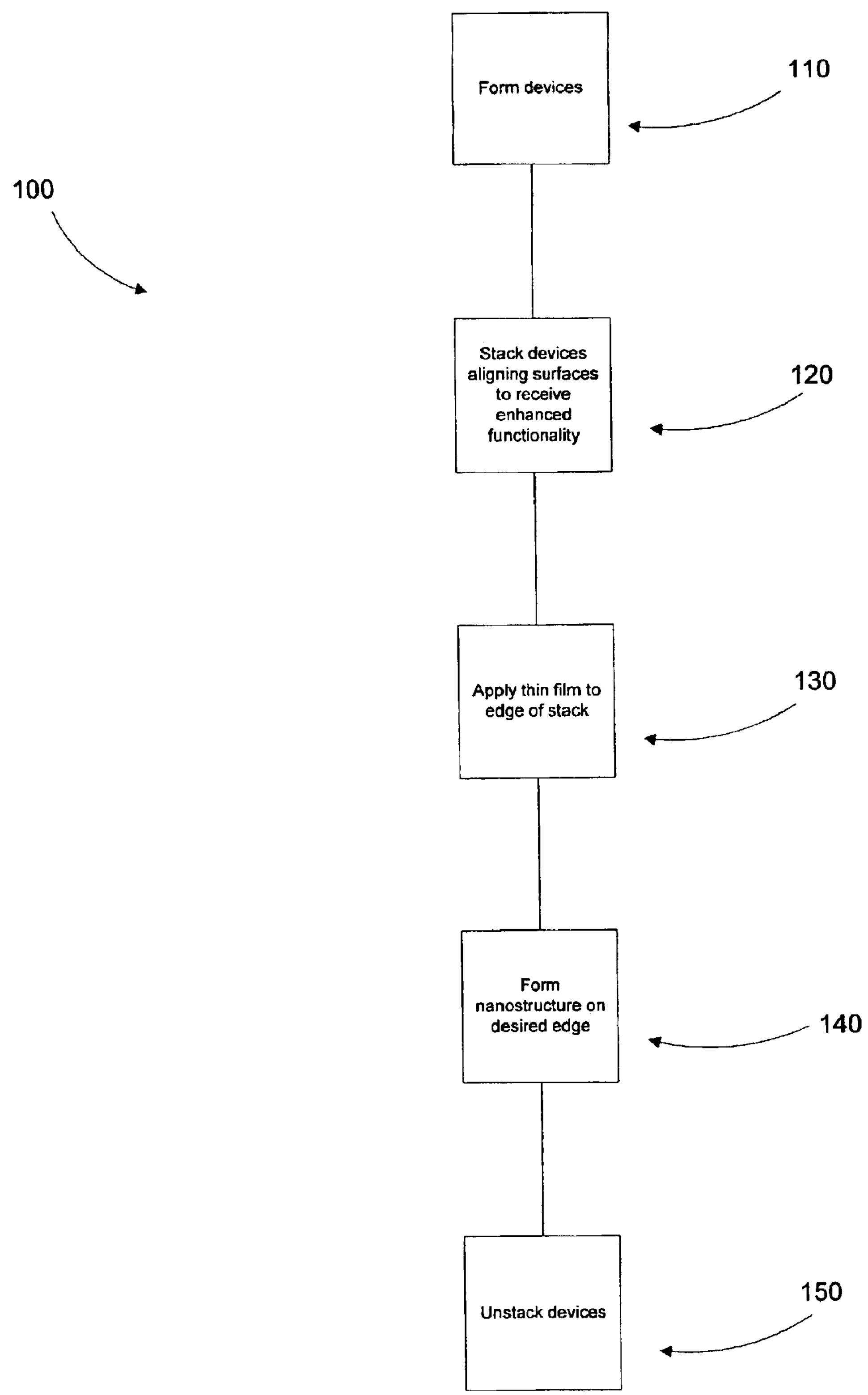
FIG. 1 illustrates a flow diagram of a method for generating multi-functional, or enhanced, photonic components according to an aspect of the present invention.

Referring now to FIG. 1, there is shown a flow diagram of a method 100 for generating multi-functional photonic components according to an aspect of the present invention. According to an aspect of the present invention, sub-wavelength optical structures, such as nanostructures or nanoelements, generally structures sized from 0.1 nm to 1000 nm, may be replicated on surfaces of devices that are generally too small to efficiently replicate or imprint such nanostructures upon using conventional techniques. According to an aspect of the present invention, method 100 generally includes forming devices 110, stacking the formed devices 120, applying a thin film to a surface of the stack of devices 130, forming nanostructures on the same surface of the stack of devices 140 and unstacking the stack of devices 150.

The devices may be formed 110 using any suitable method known to those possessing an ordinary skill in the pertinent arts, such as, for example, epitaxial growth, photolithography and etching. The devices may take the form of type III-V semiconductor compound photonic devices, for example. These devices may be active, such as a solid-state edge emitting laser, light emitting diode (LED), superluminescent light emitting diode (SLED), vertical-cavity surface emitting laser (VCSEL), modulator, switch, variable optical attenuator (VOA) or photodetector, for example, or passive, such as a waveguide, or waveguide based splitter, combiner, isolator or coupler, for example. The manufacture and use of such devices is well understood by those possessing an ordinary skill in the pertinent arts.

Figure 2A:
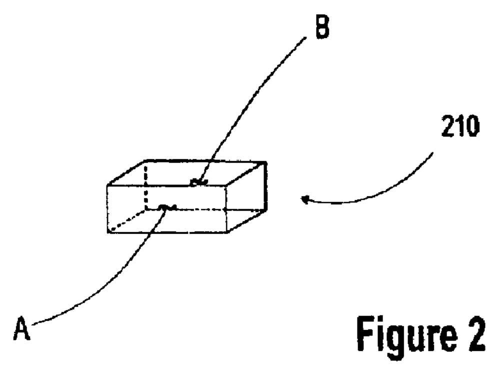
FIGS. 2*a*, 2*b* and 2*c* illustrate perspective views of devices, which may be used in the method of FIG. 1, according to an aspect of the present invention; and, FIG. 3 illustrates a block diagram of an exemplary apparatus being suitable for use with the method of FIG. 1 according to an aspect of present invention.
Figure 2B:
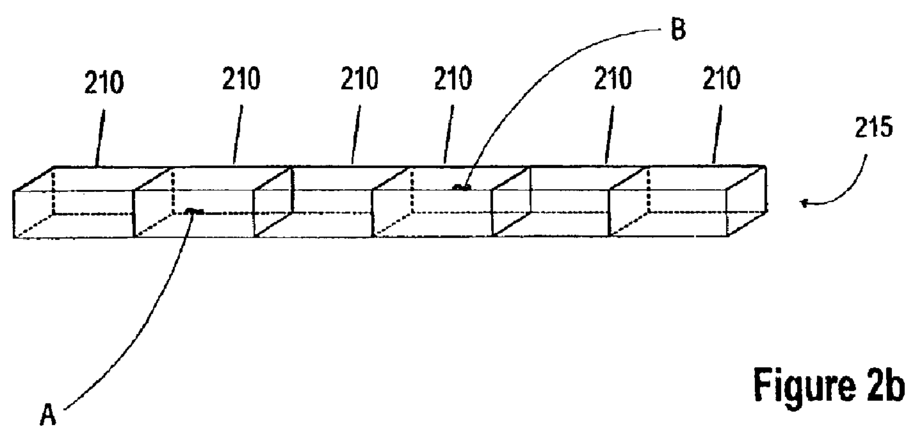
Figure 2C:
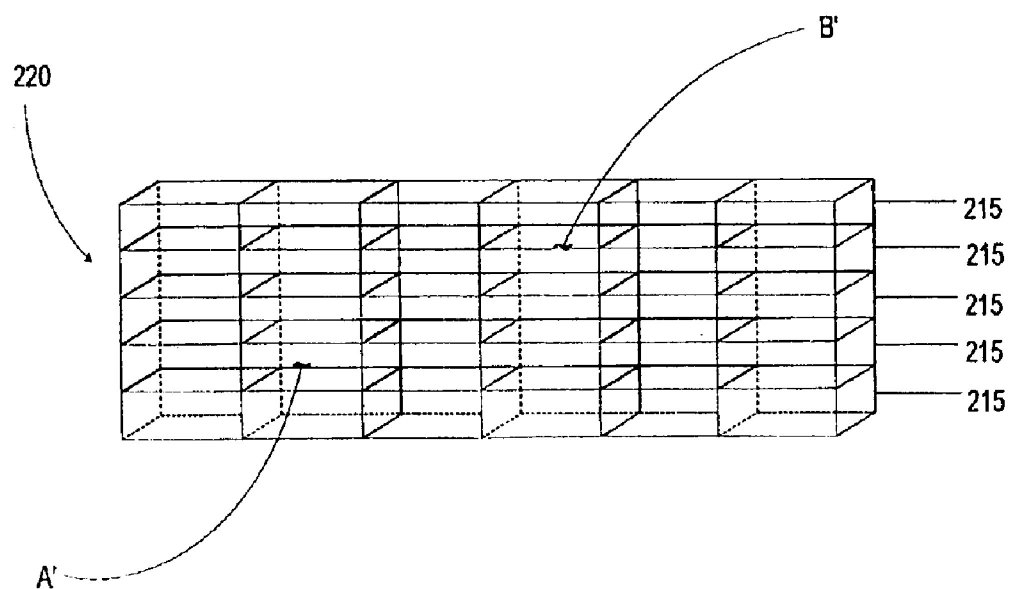

Referring now also to FIG. 2*a*, there is shown a type III-V semiconductor compound laser device 210 that may be enhanced according to an aspect of the present invention. Device 210 includes operable surfaces, including facets or interfaces A and B. In general, the operable surfaces are those that are utilized for photonic operation of the device 210 for example, and may be small in area, on the order of approximately 10 to 100 $\mu m^2$ for example. Referring now also to FIG. 2*b*, as is also well understood in the pertinent arts, devices 210 may be formed in bars 215 of devices 210. Several bars 215 may collectively form most of a wafer from which devices 210 have been initially formed 110 (FIG. 1) for example. Bars 215 may be separated after processing 110 (FIG. 1) to provide operable devices 210 or may be kept intact until after unstacking 150 (FIG. 1).

Referring to FIG. 1 and FIGS. 2*a*, 2*b* and 2*c*, devices 210 that have been formed 110 may be stacked 120 upon similar devices, or alternatively on any other device, wherein a stack of formed devices may be created 120. Multiple devices 210, or bars 215, may be stacked to create a composite stack of devices 220. In this composite stack 220, each of the surfaces A and B of the individual devices 210, or bars 215, may be aligned to form collective stack surfaces A' and B', respectively. According to an aspect of the present invention, the surfaces A' and/or B' may be used to provide enhanced functionality for each stacked device 210 by receiving the pattern of nanostructures to be provided on at least one of surfaces A and B.

As will be understood by those possessing an ordinary skill in the pertinent arts, the alignment and stacking of devices 210, or bars 215, to form stack 220 creates a larger surface area A' or B', as compared to surfaces A and B, on which to form the nanostructures. That is, while surface A or B may be too small in area for efficient replicating, the surface A' or B' may possess a sufficient surface area for replicating according to an aspect of the present invention.

This alignment and stacking 120 may be performed in any conventional manner known to those possessing ordinary skill in the pertinent art, such as by those methods conventionally used when applying anti-reflective (AR) coatings to multiple devices simultaneously for example. In order to account for non-flat surfaces which may result from height displacements of devices aligned via conventional stacking techniques, techniques known by those possessing an ordinary skill in the pertinent arts may be used, such as that disclosed in an article Xiaoyun Sun, Lei Zhuang, Wei Zhang and Stephen Y. Chou, *J. Vac. Sci. Tech B* 3922 (1998) entitled "Multilayer Resist Methods for Nanoimprint Lithography on Nonflat Surfaces", the entire disclosure of which is hereby incorporated by reference as if being set forth in its entirety herein. This article teaches one method for accounting for such surface displacements, for example, is to use a surface planarization layer. Such surface planarization may be achieved by applying, for example, a resist layer of thickness greater than the height displacements of the various devices. This layer may be applied prior to applying the replicatable layer to the surface. In doing so, the planarization layer may provide a substantially flat surface ready for replicating by filling the voids and steps associated with the alignment, for example.

Referring again to FIG. 1, a thin film may be applied 130 to surface A' and/or B'. This thin film may be suitable for receiving the formed nanostructures during lithography 140. For example, the thin film may take the form of a photoresist, polymethylmethacrylate, ultraviolet curable polymer layer or a thermoplastic layer. This film may be somewhat soft as compared to the mold allowing for easier forming, instead of the reverse.

Referring still to FIG. 1, the nanostructure may be formed 140 into the surface A' or B' using a lithographic process, such as photolithography, holographic lithography, interference lithography, e-beam lithography or that disclosed in U.S. Pat. No. 5,772,905, entitled NANOIMPRINT LITHOGRAPHY, the entire disclosure of which is hereby incorporated by reference as if being set forth in its entirety herein. This patent teaches a lithographic method for creating ultra-fine, such as sub 25 nm, patterns on a surface by using a thin film coated on a surface for receiving a nanoimprinted pattern. For purposes of completeness though, a mold having at least one protruding feature may be pressed into the thin film applied 130 to surface A' or B'. The at least one protruding feature in the mold creates at least one corresponding recess in the thin film. After replicating, the mold may be removed from the film, and the thin film processed and surface processed such that the pattern in the thin film is transferred to the operable surface. Thus, the patterns in the mold are replicated in the surface of the device. Of course, any suitable method for forming a structure into or onto an operable surface A' or B' of the stack of devices 220 may be utilized though.

Further, while surface A' or B' may be used to receive the replicated pattern of features, the nanostructures features may be of such a small size as compared to the surface A or B, that a sufficient portion of the replicated pattern may be functionally replicated on each surface A or B as well. For example, a pattern corresponding to a polarization feature may be replicated upon the surface A'. Due to the sizing of features within the replicated pattern, the pattern may also be functionally formed on each single surface A as well. A cyclical pattern with 25 nm features may be replicated into a surface A', which includes a surface A of a given device. If for example surface A is approximately 50 $\mu m^2$ in size, surface A may receive approximately 1000 cycles of the pattern replicated into surface A', an amount sufficient to enhance functionality. Thus enhanced functionality results, even though, surface A may not have sufficient area to replicate the pattern therein individually. Accordingly, enhanced functionality for a device 210 may be achieved by replicating the surface A' and therefore surface A, in such a manner.

Referring still to FIG. 1, upon replication of the nanostructures onto the surface A' or B', the stack of devices may be unstacked 150 for individual use.

Additionally, a subset of the replicated devices, for example one, all, or some quantity in between, may be used for testing. That is, a device 210, or set of devices, with enhanced functionality corresponding to the replicated pattern of features may be tested to ensure the replicated nanostructure pattern performs the desired function.

As will be recognized by those possessing ordinary skill in the pertinent arts, various patterns may be replicated into the devices. These patterns may serve various optical or photonic functions. Such patterns may take the form of holes, strips, trenches or pillars, for example, all of which may have a common period or not, and may be of various heights and widths. The strips may be of the form of rectangular grooves, for example, or alternatively triangular or semicircular grooves. Similarly pillars, basically the inverse of holes, may be patterned. The pillars may be patterned with a common period in both axes or alternatively by varying the period in one or both axes. The pillars may be shaped in the form of, for example, elevated steps, rounded semi-circles, or triangles. The pillars may also be shaped with one conic in one axis and another conic in the other.

Accordingly, the nanostructures patterned onto the device may function as virtually any optical element which may be achieved with an applied pattern, such as, for example, a polarizer, polarizing beam splitter and combiner, narrow-band filter, artificial bi-refringent waveplate, broadband polarizing reflector, lens, or tunable filter.

An illustrative use of nanostructures is for polarization management, for example a polarizer or polarizing beam splitter. The nanostructure may be patterned as a grid or grating type device. As is known in the pertinent arts, a grid structure transmits radiation with an E vector vibrating perpendicular to the grid or grating lines and reflects the parallel radiation assuming the wavelength is much larger than the grid spacing. Because the current process is capable of forming nanostructures, which are small as compared to wavelengths, polarization management may be achieved. For example, in the case where a device takes the form of a laser, and the replicated pattern corresponds to a polarizer, and the surface replicated upon is a facet of the laser, and the polarizer has a high reflectivity at the laser wavelength, a laser may be realized that lases in a single polarization.

Another illustrative use of nanostructures is for wavelength management, for example as a narrow-band filter or tunable filter. The nanostructures may take the form of a grid, for example. The functionality of a filter utilizing such a grid spacing is known in the pertinent arts. The resonance effect may be used and the grating thickness, the wavelength, and the angle of incidence varied to achieve desired results, for example. In an exemplary embodiment, energy efficient filters may be produced by being designed to admit only forward and backward propagating zero-order waves for example. At resonance, the diffraction efficiency of the forward propagating zero order wave approaches zero and the diffraction efficiency of the backward propagating wave approaches one. By following this principle, a filter with high efficiency, narrow bandwidth, and small size may be applied to another photonic device, for example.

Wherefore, by patterning nanostructures onto an operable surface, such as a facet or interface, of a photonic, optical, or optoelectronic device or component, the functionality of the device or component may be improved and costs associated with free-space packaging and assembly reduced, as the functionality of the applied pattern effectively enhances operation of the underlying device.

Figure 3:
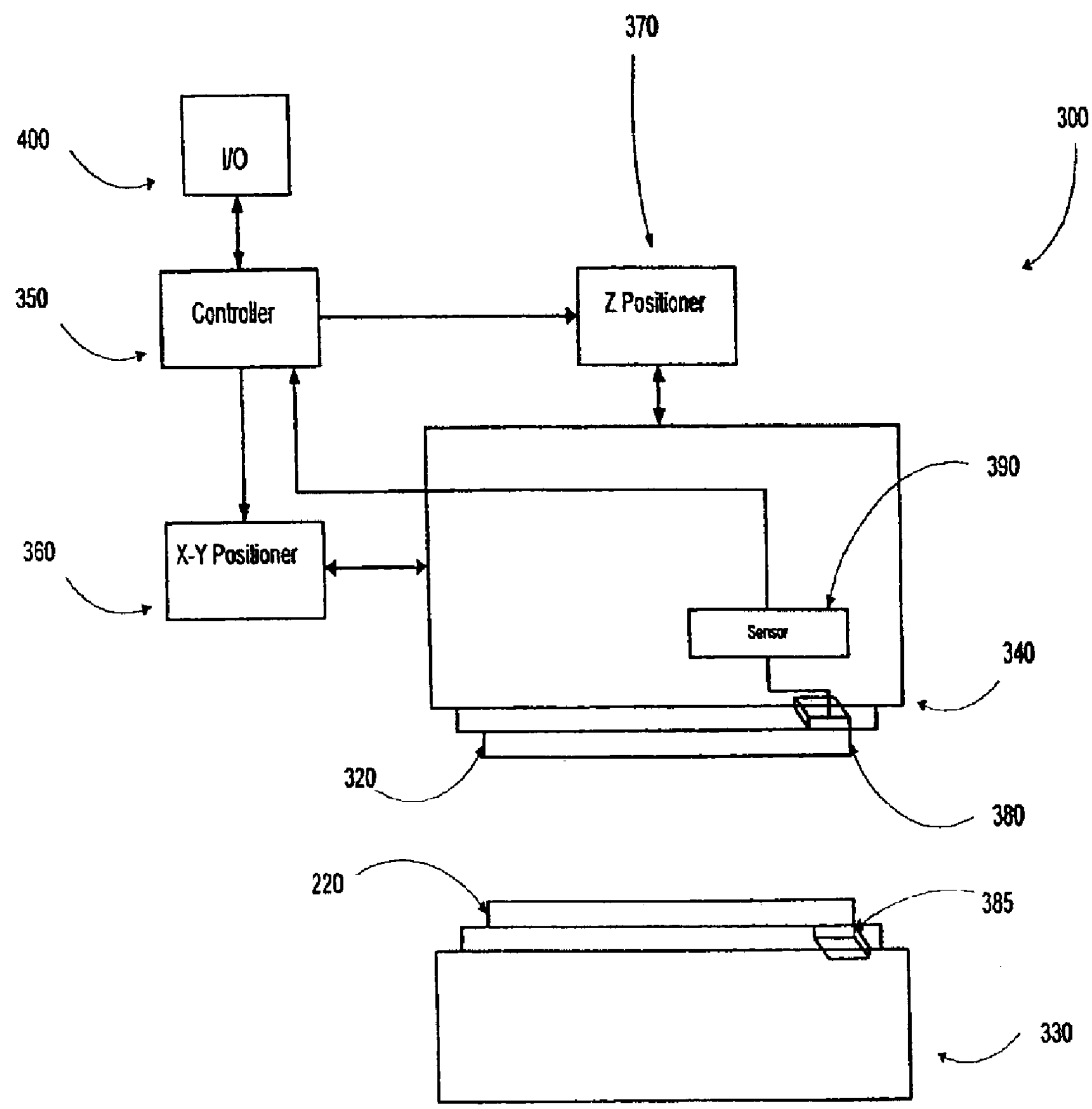

Referring now to FIG. 3, there is shown an apparatus 300 being suitable for performing the method of FIG. 1. Apparatus 300 may take the form of a replicator into which the stack of devices 220 and mold 320 may be installed. Replicator 300 may include means for applying the thin film 130 (FIG. 1) to the stack 220. Replicator 300 may include a stationary block 330 carrying the stack of devices 220 and moveable molding block 340 carrying mold 320. A controller 350 coupled to an x-y positioner 360 and z positioner 370 may control application of mold 320 against stack 220.

An alignment mark 380 may be provided on mold 320 while a complimentary mark 385 may be provided on device stack 220. A sensor 390 may be used to align alignment marks 380, 385 and provide an alignment signal to controller 350. Controller 350 may also be provided with input-output circuitry 400 for user control, for example.

In operation, controller 350 may control replicating of mold 320 into the film applied 130 (FIG. 2) to device stack 220 by actuating z positioner 370 thereby moving mold block 340 in the z direction relative to the stacked set of devices block 330. Alignment of mold 320 to device stack 220 may be achieved using optical or electrical alignment techniques by means of x-y positioner 360 for example. Sensor 390 and alignment marks 380, 385 may take the form of an optical detector and optical alignment marks, which generate a moiré alignment pattern such that moiré alignment techniques may be employed to position mold 320 relative to stack 220, for example. Such techniques are known by those possessing ordinary skill in the pertinent arts. Controller 350 may process alignment information provided by sensor 390 and adjust the position of the mold block 340 in the x-y plane relative to film using x-y positioner 360. Other suitable alignment techniques known to those possessing an ordinary skill in the pertinent arts may of course be used, though.

Those of ordinary skill in the art will recognize that many modifications and variations of the present invention may be implemented without departing from the spirit or scope of the invention. Thus, it is intended that the present invention cover the modification and variations of this invention provided they come within the scope of the appended claims and their equivalents.

What is claimed is:

1. A method for enhancing functionality of photonic devices each including at least one operable surface, said method comprising:

stacking said photonic devices such that each of said operable surfaces are aligned to form a composite surface;

applying a film adapted to receive a replication to said composite surface; and, replicating a pattern of nanostructures in said applied film, wherein substantially each of said operable surfaces is replicated with a sufficient portion of said replicated pattern of nanostructures to enhance operation of said devices by performing a given function associated with said nanostructures.

2. The method of claim 1, further comprising providing a mold including a plurality of features being indicative of said pattern of nanostructures; and, aligning said composite surface with said mold.

3. The method of claim 2, further comprising applying said aligned mold to said composite surface.

4. The method of claim 1, wherein applying said film comprises deposition of said thin film.

5. The method of claim 4, wherein the deposition deposits a thermoplastic layer.

6. The method of claim 4, wherein the deposition deposits a ultraviolet curable polymer.

7. The method of claim 1, wherein applying said film comprises spinning on the film.

8. The method of claim 7, wherein said spinning on the film comprises spinning at least one of polymethylmethacrylate, thermoplastics and photoresist.

9. The method of claim 7, wherein said spinning on the film comprises spinning an ultraviolet curable polymer.

10. The method of claim 1, wherein said at least one operable surface comprises at least a facet.

11. The method of claim 1, wherein said at least one operable surface comprises at least an interface.

12. The method of claim 1, further comprising forming at least one of said photonic devices.

13. The method of claim 12, wherein said forming comprises at least one of etching, epitaxial growth, holographic lithography, and photolithography.

14. The method of claim 1, wherein said stacking comprises stacking a bar of said photonic devices.

15. A nanostructure formed on a surface of a photonic device replicated by a process comprising:

stacking said photonic devices such that each of said operable surfaces are aligned to form a composite surface;

applying a film adapted to receive a replication to said composite surface; and, replicating a pattern of nanostructures in said applied film;

wherein substantially each of said operable surfaces are replicated with a sufficient portion of said replicated pattern of nanostructures to enhance operation of said devices by performing a given function associated with said nanostructures.

16. The product of claim 15, wherein said structure provides polarization management.

17. The product of claim 15, wherein said structure provides wavelength management.

18. The product of claim 15, wherein said photonic device comprises at least one type III-V semiconductor compound active photonic device.

19. The product of claim 15, wherein said photonic device comprises at least one type III-V semiconductor compound passive photonic device.

20. A method for providing enhanced functionality for a photonic device including at least one operable surface, said method comprising:

stacking said photonic device with other devices thereby creating a composite surface;

applying a film adapted to receive a replication to said composite surface; and, replicating a pattern of nanostructures in said applied film;

wherein substantially said surface of said photonic device is replicated with a sufficient portion of said replicated pattern of nanostructures to enhance operation of said device by performing a given function associated with said nanostructures.

21. The method of claim 20, wherein said at least one operable surface comprises at least a facet.

22. The method of claim 20, wherein said at least one operable surface comprises at least an interface.

23. The method of claim 20, further comprising forming said photonic device.

24. The method of claim 23, wherein said forming comprises at least one of etching, epitaxial growth, holographic lithography, and photolithography.

25. The method of claim 20, wherein said photonic device comprises at least one type III-V semiconductor compound active photonic device.

26. The method of claim 20, wherein said photonic device comprises at least one type III-V semiconductor compound passive photonic device.

27. The method of claim 20, wherein said stacking comprises stacking said phonic device as a portion of a bar of said photonic devices.

28. The method of claim 20, further comprising unstacking said stacked photonic device.

29. An optoelectronic device exhibiting enhanced functionality suitable for use with a transmission having at least one wavelength, said device comprising:

a surface adapted to function with said transmission; and, a plurality of nanostructures formed in said surface, wherein said nanostructures are adapted to provide enhanced functionality to said surface and said surface includes at least one garnet material.

30. An optoelectronic device exhibiting enhanced functionality suitable for use with a transmission having at least one wavelength, said device comprising:

a surface adapted to function with said transmission; and, a plurality of nanostructures formed in said surface, wherein said nanostructures are adapted to provide enhanced functionality to said surface said surface comprises an interface.

31. An optoelectronic device exhibiting enhanced functionality suitable for use with a transmission having at least one wavelength, said device comprising:

an operable surface adapted to function with said transmission; and, a plurality of nanostructures formed in said operable surface, wherein said nanostructures are adapted to provide enhanced functionality to said operable surface and said device comprises a garnet magnetic rotator.

32. An optoelectronic device exhibiting enhanced functionality suitable for use with a transmission having at least one wavelength, said device comprising:

an operable surface adapted to function with said transmission; and, a plurality of nanostructures formed in said operable surface, wherein said nanostructures are adapted to provide enhanced functionality to said operable surface and said device is active.

33. An optoelectronic device exhibiting enhanced functionality suitable for use with a transmission having at least one wavelength, said device comprising:

a surface adapted to function with said transmission; and, a plurality of nanostructures formed in said surface, wherein said nanostructures are adapted to provide enhanced functionality to said surface and said enhanced functionality includes polarization management.

34. A method for providing enhanced functionality for photonic devices each including at least one operable surface, said method comprising:

stacking said photonic devices such that each of said operable surfaces are aligned to form a composite surface;

applying a film adapted to receive a replication to said composite surface; and, replicating a pattern of nanostructures in said applied film, wherein substantially each of said operable surfaces is replicated with a sufficient portion of said replicated pattern of nanostructures to enhance operation of said devices by performing a given function associated with said nanostructures.

* * * * *